(12) United States Patent
Tschmelitsch et al.

(10) Patent No.: US 9,378,317 B2
(45) Date of Patent: Jun. 28, 2016

(54) METHOD FOR DETECTING DAMAGE TO A SEMICONDUCTOR CHIP

(71) Applicant: Infineon Technologies AG, Neubiberg (DE)

(72) Inventors: Andreas Tschmelitsch, Villach (AT); Gerhard Zojer, Schiefling am See (AT); Guenter Holl, Landskron (AT); Guentr Herzele, Techelsberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/044,140

(22) Filed: Oct. 2, 2013

(65) Prior Publication Data

US 2014/0040853 A1 Feb. 6, 2014

Related U.S. Application Data

(63) Continuation of application No. 11/837,187, filed on Aug. 10, 2007, now Pat. No. 8,575,723.

(30) Foreign Application Priority Data

Aug. 10, 2006 (DE) .......................... 10 2006 037 633

(51) Int. Cl.
*G06F 17/50* (2006.01)
*G01R 31/28* (2006.01)
*H01L 21/66* (2006.01)

(52) U.S. Cl.
CPC ........ *G06F 17/5068* (2013.01); *G01R 31/2884* (2013.01); *H01L 22/14* (2013.01); *H01L 22/34* (2013.01)

(58) Field of Classification Search
None
See application file for complete search history.

(56) References Cited

U.S. PATENT DOCUMENTS

| | | | |
|---|---|---|---|
| 4,696,578 A * | 9/1987 | Mansuria et al. | 374/45 |
| 6,022,791 A | 2/2000 | Cook et al. | |
| 6,420,883 B1 | 7/2002 | Watanabe et al. | |
| 6,449,748 B1 * | 9/2002 | Jeng | G01R 31/3173 257/48 |
| 6,649,986 B1 * | 11/2003 | Ishizaki | H01L 22/34 257/414 |
| 6,686,750 B2 | 2/2004 | Watanabe et al. | |
| 6,833,720 B1 * | 12/2004 | Daubenspeck | G01N 27/205 257/E23.002 |
| 6,949,775 B1 | 9/2005 | Takada | |
| 7,247,921 B2 | 7/2007 | Sugiura et al. | |
| 7,247,924 B2 * | 7/2007 | Geiss et al. | 257/565 |
| 7,309,998 B2 * | 12/2007 | Burns et al. | 324/762.01 |
| 7,649,200 B1 * | 1/2010 | Miller et al. | 257/48 |
| 8,012,650 B2 * | 9/2011 | Wakabayashi | 430/5 |
| 2002/0131626 A1 * | 9/2002 | Vogtmeier et al. | 382/131 |
| 2004/0129938 A1 | 7/2004 | Landers et al. | |
| 2005/0275076 A1 * | 12/2005 | Sugiura et al. | 257/678 |
| 2006/0221527 A1 * | 10/2006 | Jacobson | 361/100 |

OTHER PUBLICATIONS

Examination Report for DE102006037633.1 dated May 22, 2007, issued by the German Patent Office.

* cited by examiner

*Primary Examiner* — Erik Kielin
(74) *Attorney, Agent, or Firm* — Banner & Witcoff, Ltd.

(57) ABSTRACT

A semiconductor chip having a current source coupled between a first potential and an electrical node, a detection circuit having an input coupled to the electrical node, and a first active component coupled in series with the current source and further coupled between the electrical node and a second potential, wherein the first active component is coupled to the electrical node via a first conductive interconnect.

20 Claims, 2 Drawing Sheets

METHOD FOR DETECTING DAMAGE TO A SEMICONDUCTOR CHIP

CROSS-REFERENCE TO RELATED APPLICATIONS

This application is a continuation of U.S. patent application Ser. No. 11/837,187, filed Aug. 10, 2007, which claims priority to German Patent Application No. DE 10 2006 037 633.1, filed Aug. 10, 2006, each of which is hereby incorporated by reference herein as to its entirety.

BACKGROUND

During the production of semiconductor devices, a plurality of integrated circuits are produced simultaneously on a semiconductor wafer by means of photolithographic and other processes. After the processing of the wafer, the integrated circuits are separated from one another by sawing. The separated integrated circuits are referred to as semiconductor chips.

During the sawing process, cracks can arise in the semiconductor zones of the semiconductor chip. Protection devices for protecting circuits from these cracks are known. In such devices, a current is run through a resistor. The resistor is a diffusion resistor designed in such a way that it encloses a circuit to be protected. If a crack arises in a relevant semiconductor zone, the resistance of the resistor increases such that the voltage drop across the resistor also increases. This change in voltage drop is sensed, and in response the circuit is switched off.

A problem with these types of protection devices is that they consume a relatively large amount of power, due to the current that passes through the diffusion resistor.

SUMMARY

Various aspects are described herein. For example, according to some aspects, a semiconductor chip is provided. The semiconductor chip may include a current source coupled between a first potential and an electrical node, a detection circuit having an input coupled to the electrical node, and a first active component coupled in series with the current source and further coupled between the electrical node and a second potential, wherein the first active component is coupled to the electrical node via a first conductive interconnect.

These and other aspects of the disclosure will be apparent upon consideration of the following detailed description.

BRIEF DESCRIPTION OF THE DRAWINGS

A more complete understanding of the present disclosure may be acquired by referring to the following description in consideration of the accompanying drawings, in which like reference numbers indicate like features, and wherein.

DETAILED DESCRIPTION

Figure 1:
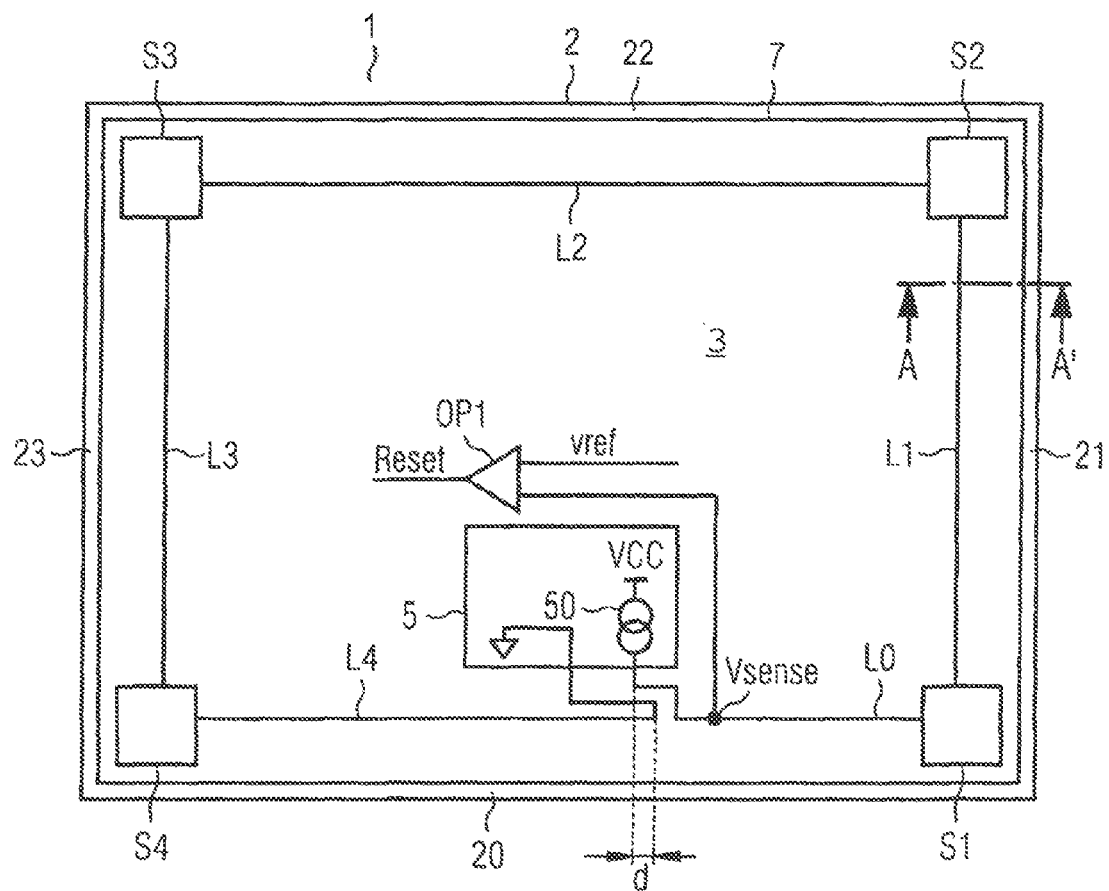
FIG. 1 is a plan view, including a schematic circuit diagram, of an illustrative embodiment of a semiconductor chip according to aspects described herein.

The various aspects summarized previously may be embodied in various forms. The following description shows by way of illustration various examples in which the above-summarized aspects, as well as other aspects, may be practiced. It is understood that other examples may be utilized, and that structural and functional modifications may be made, without departing from the scope of the present disclosure.

Except where explicitly stated otherwise, all references herein to two or more elements being "coupled," "connected," and "interconnected" to each other is intended to broadly include both (a) the elements being directly connected to each other, or otherwise in direct communication with each other, without any intervening elements, as well as (b) the elements being indirectly connected to each other, or otherwise in indirect communication with each other, with one or more intervening elements.

As will be further described herein, a circuit may be provided that identifies malfunctions of a semiconductor chip in current-saving fashion. For example, a semiconductor chip may include a current source, a detection circuit and at least one active component. The current source and the active component may be connected in series. The current source may be connected between a first potential and a connection node, and the active component may be connected between the connection node and a second potential. A current flow may thereby arise from the first potential through the current source and through the active component to the second potential. The connection between the connection node and the component and/or the connection between the component and the second potential may be effected via at least one conductive interconnect. For instance, semiconductor chips typically have at least one top side with a central zone and lateral edges. In such a case, the interconnects may be connections that are applied on the top side of the semiconductor chip above the semiconductor zones during wafer production, and may contain a conductive material such as aluminum, copper, tungsten and/or polysilicon.

The connection node may be coupled to an input of the detection circuit. The detection circuit may detect damage in the semiconductor chip on the basis of the potential of the connection node and may correspondingly output a fault message.

If the semiconductor chip is damaged by, for instance, cracks, fractures, or corrosion, the conductive interconnect from the component to the second potential and/or to the connection node may be interrupted. This may result in a change in the resistance of the conductive interconnect and therefore also in the potential at the connection node. The detection circuit may detect this potential change and thus may ascertain that damage has occurred to the semiconductor chip.

Many instances of damage to a semiconductor chip do not necessarily take place in the semiconductor zones, but rather in metallic interconnect layers and/or in the dielectric layers on which the metallic interconnect layers are fitted. Such damage is not typically detected by a conventional diffusion resistor circuit, as described previously, that is part of the semiconductor zones.

In many processes, the value of the diffusion resistors fluctuates by up to 30% around a mean value, whereby the detection threshold for the detection circuit is typically difficult to set.

Moreover, in many production methods for semiconductor wafers, the mean values of the resistances of the diffusion resistors are usually monitored poorly. Semiconductor zones into which is introduced the same dopant concentration as in transistors are generally used as diffusion resistors. If the dopant concentration is then changed in the course of production process development, in order to improve the switching speed of the transistors, this also changes the resistivity of the diffusion resistors. In many production processes, the properties of the transistors are constantly measured and checked during the routine monitoring of the production process. By contrast, no routine checking normally takes place for verifying the resistivity of the diffusion resistors, since such verification is complicated.

The current which is provided by the current source and which flows through the active component may be set to be neither too small nor too large. In the case of excessively large currents, the power consumption of the detection circuit may be increased unnecessarily. By contrast, if the current is set to be too small, capacitive couplings may influence the potential of the connection node and thus may lead to non-detection of the damage.

If the voltage at the connection node is to be set precisely, then, it may be desirable that the current/voltage ratio of the components between the connection node and the second potential be set with precision.

By means of the active component, the current from the current source and therefore also the voltage at the connection node may be set in a suitable manner, since the characteristic curves of the active components may be continually monitored in the production process and therefore may not exceed or fall below predetermined limit values.

If the current cannot be set precisely, it may be desirable to provide a bias for the current, whereby the current would increase. By contrast, as will be described herein by way of various examples, it may now be possible to more precisely set the magnitude of the current supplied by the current source, which may allow the power consumption of the semiconductor chip to be reduced.

In some embodiments, the conductive interconnects run in the region of the lateral edges. Many disturbances, such as cracks, in the semiconductor chip may proceed from the lateral edges if the semiconductor chip is subjected to mechanical loading. This may apply both to the production process and to the time during which the semiconductor chip is used in an application.

The disturbances that proceed from the lateral edges may also bring about damage to the conductive interconnect, which may be immediately detected by the detection circuit.

In some embodiments, at least four active components are connected in series between the connection node and the second potential. In such embodiments, an active component is in each case fitted at a respective lateral edge. Such a circuit may be particularly suitable where the active components additionally have a further function besides that of indicating damage. This may be the case for, e.g., temperature sensors, in which each transistor measures a temperature and a mean value is determined from the measured temperatures. In this case, the measuring transistors may be distributed on the semiconductor chip in order to compensate for the spatial dependence of the temperature distribution.

If the active component is a transistor connected as a diode (or is, in fact, an actual diode), a component may be used whose process parameters are precisely measured and checked during a customary production process.

In further embodiments, the semiconductor chip has at least one dielectric layer lying above the semiconductor material. A crack stop is in each case provided at the lateral edges, the crack stop interrupting the dielectric layer. The conductive interconnect runs between the circuits of the central zones of the semiconductor chip and the crack stop and parallel to the crack stop. This may allow the circuits of the active zone to be separated from the crack stop by the conductive interconnect, with the potential result being that cracks proceeding from the lateral edge of the semiconductor chip also affect the conductive interconnect and are immediately detected.

In some embodiments, the distance between the crack stop and the conductive interconnect may be less than or equal to 2 μm. Such a small distance can reduce the space requirement, which may make the semiconductor chip less expensive to produce. In some embodiments, the following holds true for the current $I_1$ generated by the current source: $1\ \mu A \leq |I_1| \leq 20\ \mu A$. This may both limit the current consumption and provide a sufficiently large current such that inductive or capacitive interference disturbances do not corrupt the detection result.

The current source may provide for a reliable current flow through the active components. This may be desirable in comparison with arrangements which do not have a current source. If a conductive interconnect connected to the second potential cracks in those arrangements, the connection node would attain a high impedance. Capacitive and inductive couplings on the connection node may determine the potential of the connection node. In this case, a potential of 0 V may arise on the connection node, and a crack in the conductive interconnect would likely not be detected.

In some embodiments, the output signal (e.g., the fault message) of the detection circuit is forwarded to a superordinate system if damage of the semiconductor chip is ascertained. A superordinate system may contain, in addition to the semiconductor chip, a drive circuit to which the semiconductor chip outputs output signals. This forwarding of the fault message may be desirable particularly in circuitry-critical applications. If, by way of example, the semiconductor chip is used as a sensor for airbags, an unwarranted triggering of the airbag or a non-triggering of the airbag during an accident could lead to serious damage to the health of the automobile occupants. In such a system, there is a particular need for a malfunction of a sensor chip to be reported in a timely manner in order that the semiconductor chip can be exchanged. The fault message may cause, for example, illumination of a warning light on the dashboard of the vehicle.

As an alternative, after detection of the damage, an internal voltage supply of the semiconductor chip may be switched off. In such a case, the superordinate system may detect, on the basis of the voltage supply being switched off, that the semiconductor chip is defective. It is also possible, in the case of a fault, to cause an output of the semiconductor chip to permanently output a fixed value and thus to report the fault to the superordinate system.

In some embodiments, the detection circuit contains a differential amplifier, which amplifies the difference between the voltage at the connection node and a reference voltage. As a result, the voltage may be measured directly with a reference voltage, and the fault message may be provided responsive to the reference voltage being exceeded or undershot. Other embodiments are also possible in which, with the aid of the potential of the connection node, a current is generated, for example, which is compared with a reference current.

Illustrative embodiments of methods for manufacturing the semiconductor chip are also disclosed herein. The semiconductor chip first may be designed and then may be produced in accordance with the design. The designing process may involve designing a current source and an active component. The current source and the active component may be connected in series in such a way that the current source is connected between a first potential and a connection node and the active component is connected between the connection node and an active potential. At least one conductive interconnect may be provided between the connection node and the component and/or between the component and the second potential.

The active components may be connected in series with a current source via conductive interconnects in such a way that the current source is connected between a first potential and a connection node and the active component is connected between the connection node and a second potential.

A detection circuit may be designed, wherein the connection node is coupled to the input of the detection circuit in such a way that the detection circuit detects damage in the semiconductor chip on the basis of the potential of the connection node. Cracks and/or corrosion in interconnects may be detected by means of the production method, which has not previously been possible with diffusion resistors. Since the voltage drop across the active component is known, the current from the current source may also be dimensioned precisely and in a manner that saves as much current as possible.

In some embodiments, parts of a temperature sensor are used as a current source and as active components. Existing components and connections may be used. As a result, there is not necessarily a need to additionally lay a complex ring line that increases the space requirement and therefore makes the semiconductor chip more expensive. The existing circuit block for the temperature sensor in the semiconductor chip edge region, for example, which may have a looped-through signal, may be used in order to detect a line crack in a very simple manner by evaluation of the voltage level at the connection node. This may be realized with minimal additional outlay with respect to circuitry and wiring. Moreover, it may be that little or no additional current is consumed by the provision of the detection function, since the current from the current source may be also used for the temperature measurement.

FIG. 1 schematically shows a plan view of an illustrative embodiment of a semiconductor chip 1. The top side of the semiconductor chip has a central zone 3 and an edge 2. Components of the semiconductor chip, e.g. transistors and diodes, are accommodated in the semiconductor zone in the central zone 3. Interconnects composed of polysilicon, metal, and/or other conductive materials, which connect the components of the semiconductor zones to one another, run above the semiconductor zones.

The edge 2, which is composed of four lateral edges 20, 21, 22 and 23, forms the lateral termination of the semiconductor chip 1 on the active top side. A crack stop 7 is fitted in the region of the edge 2.

The central zone 3 in this example contains, in addition to a multiplicity of circuits that are to be protected, a generating circuit 5 and a differential amplifier OP1.

The generating circuit 5 contains a current source 50 connected to a first potential VCC. The current source and the conductive interconnect L0, the active component S1, the conductive interconnect L1, the active component S2, the conductive interconnect L2, the active component S3, the conductive interconnect L3, the active component S4, and the conductive interconnect L4 are connected in series. A terminal for a ground potential is provided in the generating circuit 5, the ground terminal being connected to the conductive interconnect L4. The conductive interconnects L0, L1, L2, L3 and L4 run in the region of the lateral edges 20, 21, 22, 23 and 20, respectively.

The voltage supply for the semiconductor chip 1 is connected to the first and second potentials. The first potential VCC is at 5 V and ground is at 0 V. The current source generates a current that also flows through the conductive interconnects L0 to L4 and the active components S1 to S4.

The voltage at the connection node Vsense, which connects the current source 50 to the conductive interconnect L0, is compared with a reference voltage vref by means of the differential amplifier OP1. If the potential at the connection node Vsense exceeds the potential vref, a fault signal is output at the output Reset.

This circuit of FIG. 1 is able to identify damage to the semiconductor chip. If, by way of example, one of the conductive interconnects L0, L1, L2, L3 or L4 cracks, or if it is otherwise damaged such as by corrosion or fracture, the current flowing through the connection lines L0 to L4 may be interrupted or otherwise changed. Consequently, the potential at the node Vsense in this example rises to 5V, which triggers a fault message.

Many instances of damage of a semiconductor chip can be expected to arise in the semiconductor chip edge region. While the components in the central region 3 may be intended to be protected, the conductive interconnects L0 to L4 and the active components S1, S2, S3 and S4 completely enclose the circuits to be protected in the central zone 3. As a result, instances of damage which also proceed from just one lateral edge 20, 21, 22 or 23 may also be reliably detected before they damage the circuits to be protected in the central region 3.

In order for the active components S1 to S4 and the conductive interconnects L0 to L4 to completely enclose the circuits to be protected in this example, the conductive interconnect L4 is shown to meander in various directions at the level of the generating circuit 5, whereby the connection lines L0 and L4 are shown to run parallel over a length d. However, any combination of meandering and/or straight connection lines may be used, depending upon the particular semiconductor chip.

Figure 2:
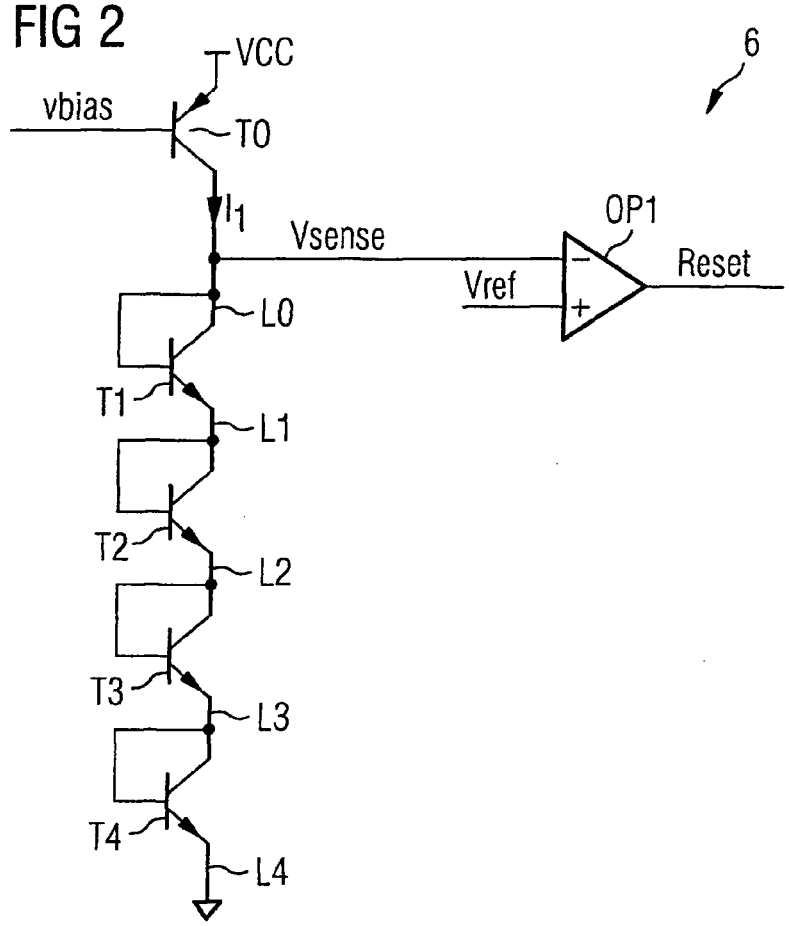
FIG. 2 is a schematic circuit diagram showing illustrative details of a detection circuit for detecting damage to the semiconductor chip of FIG. 1, in accordance with aspects described herein.

FIG. 2 shows a circuit diagram of an illustrative embodiment of a protection circuit of the semiconductor chip 1 of FIG. 1. The circuit 6 contains the transistors T0, T1, T2, T3, and T4 and also the differential amplifier OP1.

The transistor T0 in this example is a pnp transistor, the emitter of which is connected to the positive potential VCC of a voltage supply. The positive potential has a value of 5 V in the present example. The base of the transistor T0 is connected to a voltage vbias, which causes the collector current IC to have a value $I_1 = 10$ μA, which may be substantially constant even in the event of temperature fluctuations and fluctuations of the supply voltage.

The collector of the transistor T0 in this example is connected to a connection node vsense. The connection node Vsense is also connected to the transistor T1 via the conductive interconnect L0, the transistor forming the active component S1. The transistor T1 in this example is an npn transistor, the base and collector of which are short-circuited. The transistor T1 is therefore configured to function as a diode.

The emitter of the transistor T1 is connected via the conductive interconnect L1 to the base and the collector of the transistor T2, and the emitter of transistor T2 is connected to the collector and the base of the transistor T3 via the conductive interconnect L2.

The emitter of the transistor T3 is connected via the conductive interconnect L3 to the base and the collector of the transistor T4, and the emitter of transistor T4 is connected to a ground potential via the connection L4. The ground potential in this embodiment has a value of 0 V.

The current $I_1$ set, in this example, by means of the voltage vbias flows in each case through the transistors T1, T2, T3 and T4. The transistor T0 forms a current source connected in series with the conductive interconnects L0, L1, L2, L3, L4 and the transistors T1, T2, T3 and T4.

The voltage at the connection node Vsense is compared with the reference voltage Vref by means of the differential amplifier OP1. At the transistors T1, T2, T3 and T4, a voltage of 0.6 V is in each case dropped between emitter and collector at 20° C. and for the given current of 10 μA. Consequently, a voltage of 2.4 V with respect to ground is produced at the node Vsense. If the conductive interconnects L0, L1, L2, L3 and L4 are composed of metal or other highly conductive material, this results in relatively little voltage drop across the conductive interconnects. The accuracy of the temperature measurement may be thereby improved.

The reference voltage Vref is generated by means of a voltage divider (not shown), which outputs a voltage of 0.92*VCC. Given nominal VCC=5V, the result for Vref=4.6 V. If the conductive interconnects and the active components are not defective, the voltage is less than 4.6 V and the digital output Reset of the differential amplifier OP1 outputs a 0.

If one of the conductive interconnects L0, L1, L2, L3 or L4 is damaged by a crack, by a fracture, or by corrosion, the resistance of that conductive interconnect may be expected to increase. The potential of the connection node Vsense may rise, such as to a value that is equal to 5 V or close to 5 V. The digital output Reset of the differential amplifier OP1 switches from 0 to 1. The analog-to-digital conversion is effected in the differential amplifier by means of an inverter, for example. The value 1 of the signal Reset indicates a fault. In this illustrative embodiment, this fault message is output by the semiconductor chip to a superordinate system.

The current $I_1$ may be dimensioned in a suitable manner. If it is chosen to be too large, the power consumption of the semiconductor chip may rise unnecessarily. In the case of excessively small values of the current $I_1$, there is the risk of capacitive or inductive couplings to the conductive interconnect L0 bringing about a large voltage change at the connection node Vsense. A triggering of the fault signal may occur as a result, even if the conductive interconnects L0, L1, L2, L3 and L4 are not damaged at all.

The circuit shown may additionally serve to perform one or more other functions, such as temperature measurement. In the example shown, the collector-emitter voltages of the transistors T1, T2, T3 and T4 in each case depend on the temperature. The semiconductor chip may be expected to be exposed to in a certain temperature range. For example, where the semiconductor chip is used in an automotive application, it may be expected to experience a temperature range of −40° C. to +90° C. ambient temperature. The voltage Vsense, as a sum of the collector-emitter voltages of the four transistors T1, T2, T3 and T4, therefore also depends on the measured temperature. If it is assumed that the collector-emitter voltage of each transistor in this example decreases by 2 mV per kelvin as the temperature rises, the voltage at the node vsense would be 1.92 V at a temperature of −40° C. and 2.96 V at a temperature of 90° C.

The transistors T1, T2, T3 and T4 may be distributed across the semiconductor chip, such as one in each of the four corners of the semiconductor chip 1 as in FIG. 1. The corners are produced by the points of intersection of in each case two lateral edges 20, 21, 22, 23. As a result of the distribution of the transistors T1, T2, T3, T4, the emitter-collector voltages of which are linearly dependent on the temperature, a mean value may be determined of the temperatures measured in the four corners.

The connection node Vsense may be additionally connected to an input of an analog-to-digital (A/D) converter for processing the temperature measurement, wherein the A/D converter outputs a value for the temperature. A temperature may be indicated in the voltage range of, for example, between 1.8 V and 3.2 V. If the voltage rises above a certain value, such as 0.92*VCC in this example, the fault message that the semiconductor chip is damaged may be output by the differential amplifier OP1.

Since the transistors T0, T1, T2, T3 and T4, and also the conductive interconnects L0, L1, L2, L3 and L4 for the semiconductor chip may act as temperature sensors, it may be unnecessary to additionally provide an additional line around the semiconductor chip for damage detection.

Figure 3:
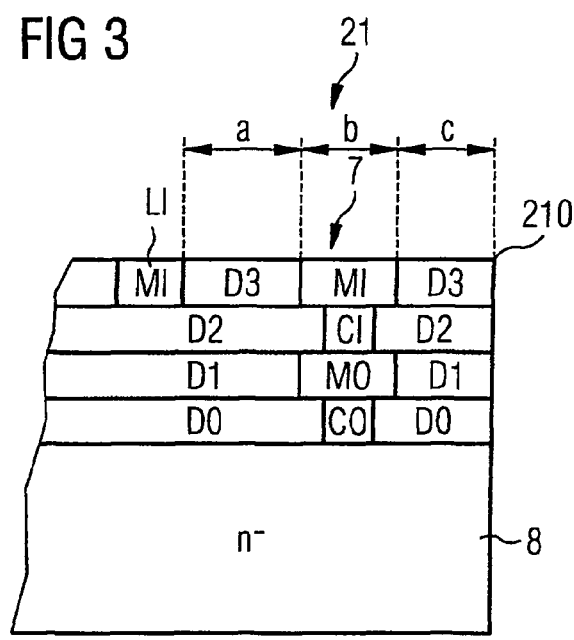
FIG. 3 is an illustrative cross-sectional side view of the semiconductor chip of FIG. 1 along the line A-A', in accordance with aspects described herein.

FIG. 3 shows an illustrative cross section through the semiconductor chip from FIG. 1 along line A-A'. The semiconductor chip 1 contains a semiconductor body 8 containing semiconductor zones composed of, e.g., silicon or other semiconductor material. The semiconductor zones may be undoped or may be doped as p-type or n-type zones.

Insulating dielectric layers and conductive interconnects may be applied above the semiconductor zones. The dielectric layers D0, D1, D2 and D3 as shown are stacked one above another. The interconnects M0 and M1 as shown are situated at the same level as the dielectric layers D1 and D3, respectively.

The contact layer C1 is provided between the interconnects M0 and M1, and produces a conductive connection between M0 and M1. Between M0 and the semiconductor zones, the contact layer C0 is provided at the same level as the dielectric layer D0.

The rim 210 of the lateral edge 21 that is shown on the right of FIG. 3 identifies the lateral termination of the semiconductor chip 1. A crack stop 7 including a stack of C0, M0, C1 and M1 is provided in the region of the lateral edge 21. The stack runs in all the lateral edges, such that the crack stop 7, as a closed ring, completely surrounds the central zone 3 of the semiconductor chip 1. The crack stop 7 interrupts the dielectric layers D0, D1, D2 and D3 in order to stop cracks that propagate in the layers from the lateral edge.

Despite the crack stop 7, fractures, corrosion, and cracks which damage the semiconductor chip can nevertheless still occur. For this reason, the conductive interconnect L1 is provided on the left of the crack stop 7, said conductive interconnect here being embodied in M1. If, by way of example, a fracture proceeds from the lateral edge 21, the conductive interconnect L1 is also interrupted, which is identified by the detection circuit OP1. The central zone 3 with the circuits to be protected is situated on the left of the conductive interconnect L1. Before the circuits to be protected are damaged, the detection circuit may already detect the fracture and outputs a fault message.

The shortest distance between the interconnect M1 of the crack stop 7 and the conductive interconnect L1 is depicted as "a" and is chosen to be a ≤2 μm in order not to have to provide too much space for the connection line and in order that damage is already detected in the vicinity of the lateral edge 21. In the example shown, the width "b" of the interconnect M1 of the crack stop 7 is 1 μm, and the shortest distance "c" between the crack stop 7 and the rim 210 is likewise 1 μm.

The invention claimed is:
1. A method for producing a semiconductor chip, the method comprising:
arranging a plurality of semiconductor components in a semiconductor zone of the semiconductor chip, the plurality of semiconductor components comprising at least one electrical circuit;
arranging at least one interconnect at a periphery of the semiconductor zone, wherein the at least one intercon- nect separates the plurality of semiconductor components from a crack stop located in a first dielectric layer of the semiconductor chip;

arranging at least two transistors at the periphery of the semiconductor zone as at least two temperature sensors;

electrically coupling a current source and the at least two transistors in series to the at least one interconnect; and creating a detection circuit configured to compare a voltage of the at least one interconnect with a predefined reference voltage, wherein the detection circuit is configured to detect a change in the voltage of the at least one interconnect, to identify a temperature, detected by the at least two temperature sensors, corresponding to the voltage of the at least one interconnect within a particular voltage range below the predefined reference voltage, and to identify a presence of damage to at least one portion of the semiconductor chip corresponding to the voltage of the at least one interconnect being above the predefined reference voltage.

2. The method of claim 1, wherein the arranging the at least one interconnect comprises arranging a plurality of interconnects to substantially surround the semiconductor zone of the semiconductor chip.

3. The method of claim 2, wherein each of the at least two transistors comprises a diode-connected transistor.

4. The method of claim 2, wherein the semiconductor chip comprises a plurality of edges surrounding the semiconductor zone, and wherein the arranging the at least one interconnect comprises arranging a plurality of interconnects to each run in a direction parallel with a different one of the plurality of edges surrounding the semiconductor zone.

5. The method of claim 1, wherein the arranging the at least one interconnect comprises arranging the at least one interconnect to be parallel with a side of the crack stop in the first dielectric layer of the semiconductor chip, between the semiconductor zone and the crack stop.

6. The method of claim 1, wherein the creating the detection circuit comprises creating the detection circuit to identify the temperature as a mean temperature based on the voltage of the at least one interconnect.

7. The method of claim 1, wherein the semiconductor chip comprises a plurality of edges surrounding the semiconductor zone, and wherein the arranging the at least one interconnect comprises arranging the at least one interconnect to comprise a first segment and a second segment connected together in series and both between the semiconductor zone and a first edge of the plurality of edges, wherein the first segment and the second segment are parallel to each other.

8. A method for producing a semiconductor chip, the method comprising:

arranging a plurality of conductive interconnects to each be in parallel with a different lateral edge of a plurality of lateral edges of the semiconductor chip;

arranging a plurality of diode-connected transistors coupled in series with each other via the plurality of conductive interconnects and configured to perform as a plurality of temperature sensors, wherein each of the plurality of diode-connected transistors is arranged at an intersection between two lateral edges of the plurality of lateral edges; and creating a detection circuit configured to compare a voltage of at least one of the plurality of conductive interconnects with a predefined reference voltage, wherein the detection circuit is configured to detect a change in the voltage of the at least one of the plurality of conductive interconnects, to identify a temperature, detected by the plurality of temperature sensors, corresponding to the voltage of the at least one of the plurality of conductive interconnects within a particular voltage range below the predefined reference voltage, and to identify a presence of damage to the at least one of the plurality of conductive interconnects corresponding to the voltage of the at least one of the plurality of conductive interconnects being above the predefined reference voltage.

9. The method of claim 8, wherein each of the plurality of diode-connected transistors comprises a gate terminal and a collector terminal connected together.

10. The method of claim 8, further comprising:

arranging a plurality of semiconductor components in a semiconductor zone of the semiconductor chip, the plurality of semiconductor components comprising at least one electrical circuit, wherein the plurality of conductive interconnects are arranged substantially surround the semiconductor zone.

11. The method of claim 10, wherein the arranging the plurality of conductive interconnects comprises arranging each of the plurality of conductive interconnects in parallel with a side of a crack stop in a dielectric layer of the semiconductor chip, between the semiconductor zone and the crack stop.

12. The method of claim 8, wherein the creating the detection circuit comprises creating the detection circuit to be configured to use the voltage of the at least one of the plurality of conductive interconnects to identify the presence of the damage by:

comparing the voltage of the at least one of the plurality of conductive interconnects with the predefined reference voltage; and generating, responsive to an outcome of the comparing, a signal indicating the presence of the damage.

13. The method of claim 12, wherein the creating the detection circuit comprises creating the detection circuit to be configured to generate the signal responsive to the outcome of the comparing being that the voltage of the at least one of the plurality of conductive interconnects exceeds the reference voltage.

14. The method of claim 8, wherein the arranging the plurality of conductive interconnects comprises arranging each of the plurality of conductive interconnects to be coupled to another of the plurality of conductive interconnects via one or more transistors.

15. The method of claim 8, wherein the arranging the plurality of conductive interconnects comprises arranging the at least one of the plurality of conductive interconnects to comprise a first segment and a second segment connected together in series, wherein the first segment and the second segment are parallel to each other.

16. A method for producing a semiconductor chip, the method comprising:

arranging a conductive interconnect on the semiconductor chip;

arranging a current source on the semiconductor chip to be coupled between a first electrical node and a second electrical node, wherein the first electrical node is configured to be coupled to a first potential;

arranging an active component on the semiconductor chip to be coupled between the second electrical node and a third electrical node in series with the current source, wherein the active component is coupled to the second electrical node via the conductive interconnect, wherein the third electrical node is configured to be coupled to a second potential, and wherein the active component comprises a temperature sensor; and creating a detection circuit configured to compare a voltage of the conductive interconnect at the second electrical node with a predetermined reference voltage, to identify a presence of a defect in the semiconductor chip corresponding to the voltage of the conductive interconnect being above the predetermined reference voltage, and to identify a temperature, detected by at least the temperature sensor, corresponding to the voltage of the conductive interconnect being within a particular voltage range below the predetermined reference voltage.

17. The method of claim 16, wherein the arranging the conductive interconnect comprises arranging the conductive interconnect to run in a direction parallel with a lateral edge of the semiconductor chip.

18. The method of claim 16, wherein the arranging the conductive interconnect comprises arranging the conductive interconnect to run in parallel with a side of a crack stop in a dielectric layer of the semiconductor chip.

19. The method of claim 16, wherein the creating the detection circuit comprises creating the detection circuit to be configured to identify the presence of the defect by generating, responsive to the outcome of the comparing, a signal indicating the presence of the defect.

20. The method of claim 16, further comprising creating a circuit of the semiconductor chip that is configured to generate a signal representing an average temperature of the semiconductor chip.

* * * * *